US010672541B2

(12) United States Patent
Bockarev et al.

(10) Patent No.: US 10,672,541 B2
(45) Date of Patent: Jun. 2, 2020

(54) INSULATOR ARRANGEMENT FOR AN OVERHEAD LINE

(71) Applicant: SIEMENS AKTIENGESELLSCHAFT, Munich (DE)

(72) Inventors: Alexander Bockarev, Berlin Marzahn-Hellersdorf (DE); Daniel Flohe, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 297 days.

(21) Appl. No.: 15/561,216

(22) PCT Filed: Mar. 9, 2016

(86) PCT No.: PCT/EP2016/055033
§ 371 (c)(1),
(2) Date: Sep. 25, 2017

(87) PCT Pub. No.: WO2016/150709
PCT Pub. Date: Sep. 29, 2016

(65) Prior Publication Data

US 2018/0068767 A1 Mar. 8, 2018

(30) Foreign Application Priority Data

Mar. 24, 2015 (EP) .................................... 15160534

(51) Int. Cl.
*H01T 1/14* (2006.01)
*H01B 17/42* (2006.01)
(Continued)

(52) U.S. Cl.
CPC ............. *H01B 17/42* (2013.01); *H01B 17/14* (2013.01); *H01C 7/12* (2013.01); *H01T 1/16* (2013.01);
(Continued)

(58) Field of Classification Search
USPC .................................................. 361/117–119
See application file for complete search history.

(56) References Cited

U.S. PATENT DOCUMENTS 4,467,387 A 8/1984 Bergh et al.
5,191,503 A * 3/1993 Kawamura .............. H01T 1/15 361/127
(Continued)

FOREIGN PATENT DOCUMENTS

CN 201000800 Y 1/2008
CN 101645580 A 2/2010
(Continued)

*Primary Examiner* — Danny Nguyen
(74) *Attorney, Agent, or Firm* — Laurence Greenberg; Werner Stemer; Ralph Locher

(57) ABSTRACT

An insulator arrangement for an overhead line includes a suspension insulator for securing an overhead line to a tower and a line arrester arrangement which is disposed electrically parallel to the suspension insulator. The line arrester arrangement has a surge arrester, which is electrically connected to ground or earth potential, and a spark gap, which is connected to the surge arrester in series and which includes a first spark electrode connected to the overhead line and a second spark electrode connected to the surge arrester. The line arrester arrangement has an assembly or mounting insulator which can be secured to the overhead line. The first spark electrode is secured to a first securing device at a first end of the assembly or mounting insulator, and the second spark electrode is secured to a second securing device at a second end of the assembly or mounting insulator.

9 Claims, 3 Drawing Sheets

(51) Int. Cl.

| | |
|---|---|
| ***H01T 1/16*** | (2006.01) |
| ***H01T 4/14*** | (2006.01) |
| ***H01B 17/14*** | (2006.01) |
| ***H01C 7/12*** | (2006.01) |
| *H01T 4/08* | (2006.01) |
| *H01T 4/06* | (2006.01) |
| *H01T 1/20* | (2006.01) |

(52) U.S. Cl.
CPC .................. *H01T 4/14* (2013.01); *H01T 1/14* (2013.01); *H01T 1/20* (2013.01); *H01T 4/06* (2013.01); *H01T 4/08* (2013.01)

(56) References Cited

U.S. PATENT DOCUMENTS 5,283,709 A * 2/1994 Shirakawa ............. H02G 13/00 361/117
5,663,863 A * 9/1997 Ohashi ...................... H01T 4/14 361/118
6,002,571 A 12/1999 Joulie et al.
7,292,424 B2 11/2007 Takasu et al.
2011/0057667 A1* 3/2011 Tsuge ................. G01R 31/1236 324/551
2012/0087055 A1 4/2012 Woodworth et al.

FOREIGN PATENT DOCUMENTS

| | | | |
|---|---|---|---|
| CN | 203260987 | U | 10/2013 |
| DE | 69833634 | T2 | 12/2006 |
| EP | 0406099 | B1 | 3/1994 |
| EP | 1432089 | A1 | 6/2004 |
| FR | 2825525 | A1 | 12/2002 |
| JP | H0473880 | A | 3/1992 |
| JP | 2002093256 | A | 3/2002 |
| JP | 2008262865 | A | 10/2008 |
| JP | 2011065785 | A | 3/2011 |

* cited by examiner

INSULATOR ARRANGEMENT FOR AN OVERHEAD LINE

BACKGROUND OF THE INVENTION

Field of the Invention

The invention applies to the field of electrical engineering and specifically relates to an insulator arrangement for an overhead line. Such overhead lines are used in electricity transmission networks to transport electrical energy in the high voltage range. Individual, cable-like conductors are usually to be secured to towers by means of suspension insulators. Line arresters are utilized in this context for the electrical protection of the overhead lines, in order to discharge overvoltages that occur, for example due to a lightning strike, to earth potential.

In an electricity transmission network, in particular in high voltage networks having voltages above 1 kV, line arresters are connected in parallel to a line insulator of the overhead line. They contain an arrester element made from non-linear metal oxide resistors in a porcelain or plastic housing. Line arresters are preferably utilized where back flashovers frequently occur due to missing or insufficient shield wire protection and/or high tower footing resistances (e.g., in the case of extremely rocky ground). In order to subsequently increase the service reliability of existing transmission or distribution lines, the installation of line arresters on all towers or only a few towers is often a cost-effective alternative to improving the shield wire protection or the tower grounding conditions. Line arresters are utilized in technology without a spark gap as well as in conjunction with an external serial spark gap, which insulates the arresters during normal operation with respect to switching overvoltages, or after an overloading of the line. Only line arresters having a serial spark gap will be considered in the following.

A line arrester having an external serial spark gap (an externally gapped line arrester, or EGLA) has a spark gap connected to the arrester element in series. One end of the line arrester is grounded at a grounding point of the overhead line tower; located at the other end is a spark electrode which forms a spark gap together with an arcing horn on the high voltage-side end of the line insulator. Instead of the arcing horn, the overhead line itself can also function as the high voltage-side end of the spark gap.

If an overvoltage occurs in the overhead line, for example due to a lightning strike, the spark gap is short-circuited by an electric arc and the overvoltage is discharged in a controlled manner by the line arrester toward the earth. After the overvoltage dies off, the spark gap is extinguished and insulates the line arrester with respect to the high voltage. Line arresters having an external serial spark gap are standardized in IEC 60099-8. Such a line arrester having an external serial spark gap is described in US 2012/0087055 A1.

Line arresters having an external serial spark gap are frequently retrofitted in existing high voltage networks. In this case, there is a problem that the line-arrester suspension device must be adapted to the particular conditions at the site.

SUMMARY OF THE INVENTION

The problem addressed by the present invention is that of providing an insulator arrangement for an overhead line, which allows for easy installation, even in the case of retrofitting.

The problem is solved by the features of the invention according to the main patent claim. The dependent claims comprise advantageous embodiments of the solution according to the invention. The invention therefore specifically relates to an insulator arrangement for an overhead line, comprising a suspension insulator for securing an overhead line to a tower, and a line arrester arrangement situated electrically in parallel to the suspension insulator and comprising a surge arrester which is electrically connected to earth potential, and a spark gap which is connected to said surge arrester in series and which comprises a first spark electrode connected to the overhead line and a second spark electrode connected to the surge arrester.

The problem is solved according to the invention in that the line arrester arrangement comprises a mounting insulator which can be secured to the overhead line, wherein the first spark electrode is secured to a first securing device at a first end of the mounting insulator and the second spark electrode is secured to a second securing device at a second end of the mounting insulator.

The mounting insulator is preferably designed as a stiff long-rod insulator. It provides, together with the two securing devices, a mounting for the surge arrester and the spark electrodes. Each spark electrode can either be mounted via one end directly on the securing device, or the spark electrode is secured to one end of a surge arrester which, in turn, is secured via its other end to the securing device. The distance between the two spark electrodes and, therefore, the spark gap, is established via the length of the mounting insulator. The mounting insulator therefore forms, together with the surge arrester and the spark electrodes, a mechanically stable, compact unit which can be easily secured to the overhead line via a holding device. The connection to the earth potential can take place via a ground wire to the tower. Such a line arrester arrangement is independent of securing devices to be installed on the suspension insulators and can be secured to the overhead line close to or at a certain distance away from the suspension insulator.

According to one advantageous embodiment of the invention, the mounting insulator is designed as a long-rod insulator. As a result, the mounting insulator can be provided as a prefabricated product which can be manufactured in large quantities for a low price. Such rod insulators usually consist of a glass fiber-reinforced plastic material which is protected against weather conditions by means of a weatherproof coating in the form, for example, a silicone material.

Advantageously, the mounting insulator can have a lower mechanical stability than the suspension insulator. As a result, the total assembly can be manufactured particularly cost-effectively.

According to yet another advantageous embodiment of the invention, the first and/or second securing device connects spark electrodes or a surge arrester to the mounting insulator in an angularly rigid manner.

Due to the angularly rigid connection of the spark electrode or the surge arrester to the mounting insulator, the length of the spark gap is established and remains unchanged for a relatively long time. The angularly rigid securing can include a pivoting device which allows for an orientation of the spark electrode or the surge arrester during assembly. After the orientation has been carried out, the pivoting device can be fixed, for example, by means of clamping screws, and is angularly rigid again.

According to yet another advantageous embodiment of the invention, the line arrester arrangement comprises at least two surge arresters.

In addition, the invention can be advantageously designed in such a way that the spark gap is situated between the two surge arresters.

The two surge arresters are separated from each other by the spark gap. Due to the allocation of the function of the surge arrester to two individual surge arresters, the surge arresters can be designed to be shorter and are therefore subjected to less flexural stress.

Each of the surge arresters can then carry, for example, one spark electrode of the spark gap. The particular spark electrode is usefully situated and secured to an end fitting of the surge arrester in each case.

Preferably, a surge arrester is secured to each of the securing devices in an angularly rigid manner via a first end and a spark electrode is situated at a second end of each surge arrester. In this way, the function of the surge arrester is allocated to two preferably identical parts. Each part consists of a surge arrester and a spark electrode secured thereto. Each of the two parts is secured to one of the securing devices. In this case, the surge arresters are each secured, via one end, to the securing device in an angularly rigid manner. The spark electrodes are each situated at the other end of the surge arrester and, together, form the spark gap.

One advantageous embodiment of the invention can provide, in this case, that at least one spark electrode is rod-shaped, is situated at the end of a surge arrester, and is slanted, via its longitudinal axis, with respect to the longitudinal axis of the surge arrester.

In this case, it can also be provided, for example, that the two surge arresters are identically designed.

Due to the optionally pivotable securing devices, the two surge arresters can be adjusted with respect to each other, for example in terms of their angles, whereby the angular relationship of the rigid spark electrodes is also adjustable, as is the spacing of the spark electrodes with respect to each other. In addition, it can also be advantageously provided that the spark electrode is rotatable about the longitudinal axis of the surge arrester.

When the spark electrodes are rotatable with respect to the longitudinal axis of the particular surge arrester to which it is secured, an adjustment of the spacing of the two spark electrodes with respect to each other can also take place via a rotation of the spark electrodes.

BRIEF DESCRIPTION OF THE SEVERAL VIEWS OF THE DRAWING

The invention is shown and described in the following with reference to exemplary embodiments in figures of a drawing, in which.

DESCRIPTION OF THE INVENTION

Figure 1:
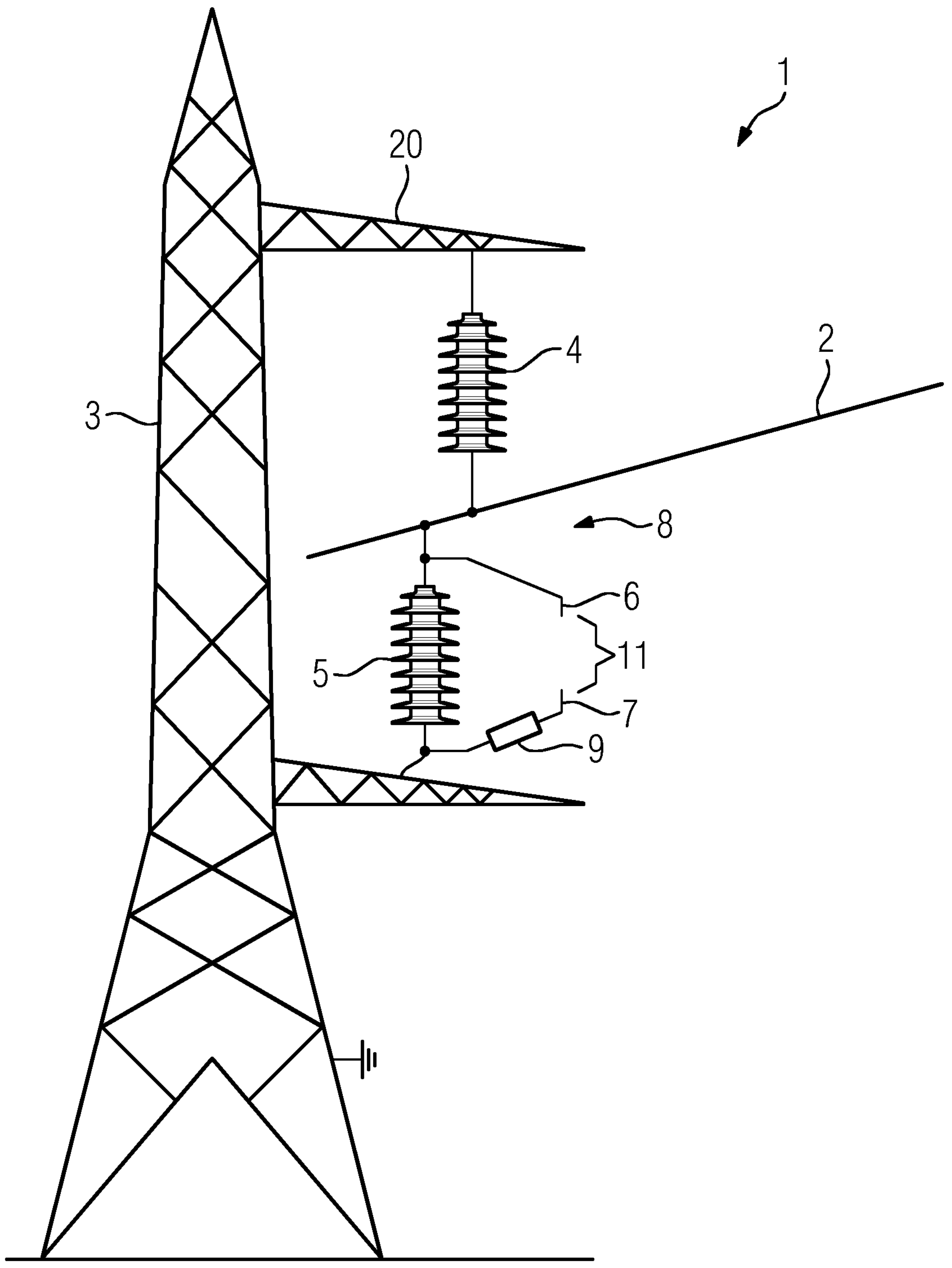
FIG. 1 shows a side view of a transmission tower including a section of an overhead line and an insulator arrangement according to the invention.

FIG. 1 shows, in detail, an overhead line tower 3 comprising a cross-arm 20 which is a horizontal arm for holding an overhead line 2. Such overhead lines 2 are designed, for example, as stranded, rope-shaped lines for conducting electrical energy.

It is generally common to support such overhead lines 2 on the cross-arms 20 of towers 3 by means of suspension insulators 4. Such suspension insulators 4 are usually made from porcelain or another inorganic material, or from a material such as glass fiber-reinforced plastic, and usually comprise shields for lengthening the creepage distance. When plastics are used, an outer coating is usually provided, which consists of silicone, for example, and forms the shield.

The suspension insulators 4 must support the weight of the overhead line 2, on the one hand and, on the other hand, must absorb the forces that are present due to the slackening of the overhead line. For this reason, such suspension insulators 4 are generally designed to be mechanically stable. According to the present invention, a line arrester arrangement 8 is electrically connected in parallel to the suspension insulator 4. The suspension insulator 4 as well as the line arrester arrangement 8 are electrically connected to the earth between the overhead line 2 and via the tower 3. The line arrester arrangement 8 has the function, in the event that overvoltages occur in the overhead line 2, for example due to lightning strikes, of discharging the overvoltage that occurs toward the earth. The line arrester arrangement 8 consists of a mounting insulator 5, a surge arrester 9, and two spark electrodes 6, 7. The suspension insulator 4 is connected via a first end to the overhead line 2. The second end of the mounting insulator 5, which is positioned opposite said first end, is connected via an earthing cable to the tower 3 or a cross-arm 20 and, thereby, to earth potential. A spark electrode 6 is secured to the first end of the mounting insulator 5. A surge arrester 9 is secured to a second spark electrode 7 at the second end of the mounting insulator 5. The intermediate space between the spark electrodes 6, 7 forms the spark gap 11. Therefore, the mounting insulator 5 is, on the one hand, a securing means for the spark electrode 6 and the surge arrester 9 and, via its length, simultaneously establishes the spacing of the spark electrodes 6 and 7 and, therefore, the length of the spark gap 11.

Figure 2:
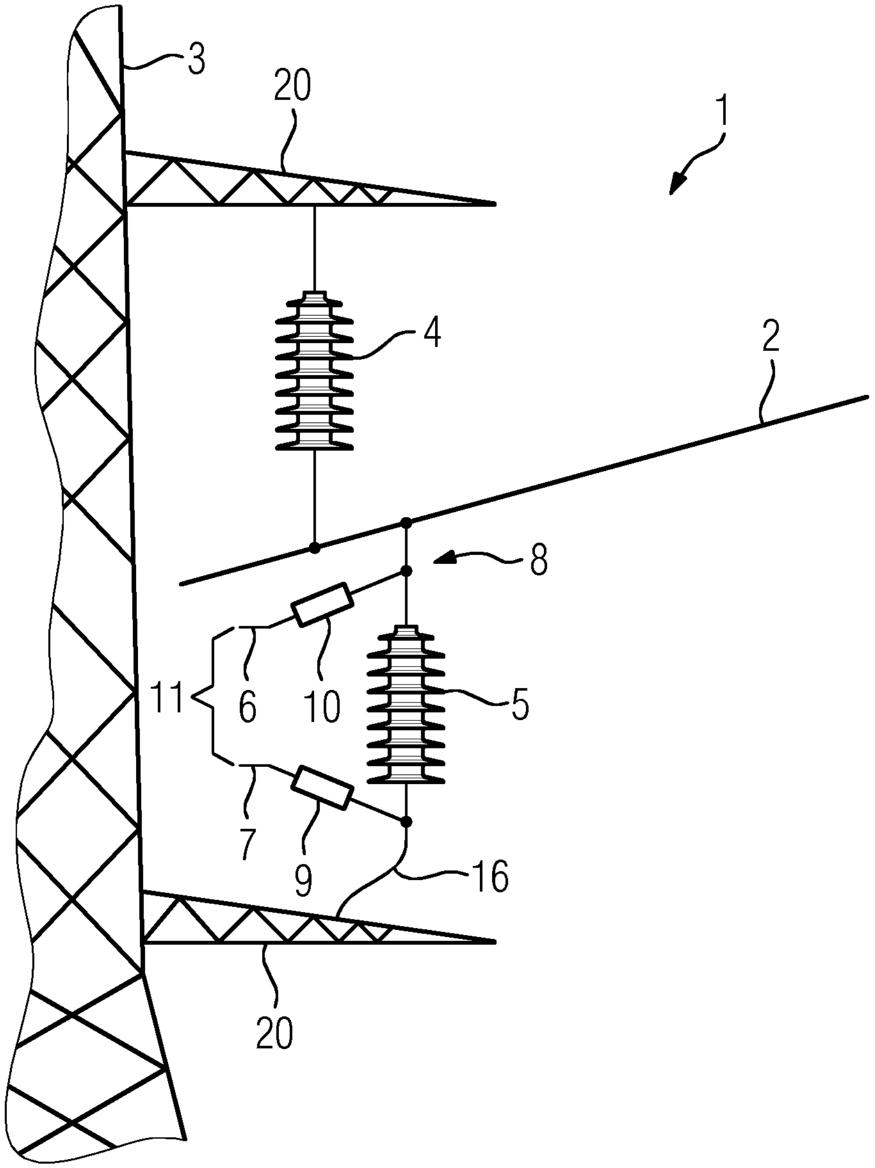
FIG. 2 shows a section of a device similar to that in FIG. 1, wherein the design of the insulator arrangement is different from FIG. 1.

FIG. 2 shows an alternative embodiment of the invention, wherein the tower is only partially shown as compared to FIG. 1. In contrast to FIG. 1, surge arresters 9, 10 comprising spark electrodes 6, 7 are secured here to the first and the second ends of the mounting insulator 5.

Figure 3:
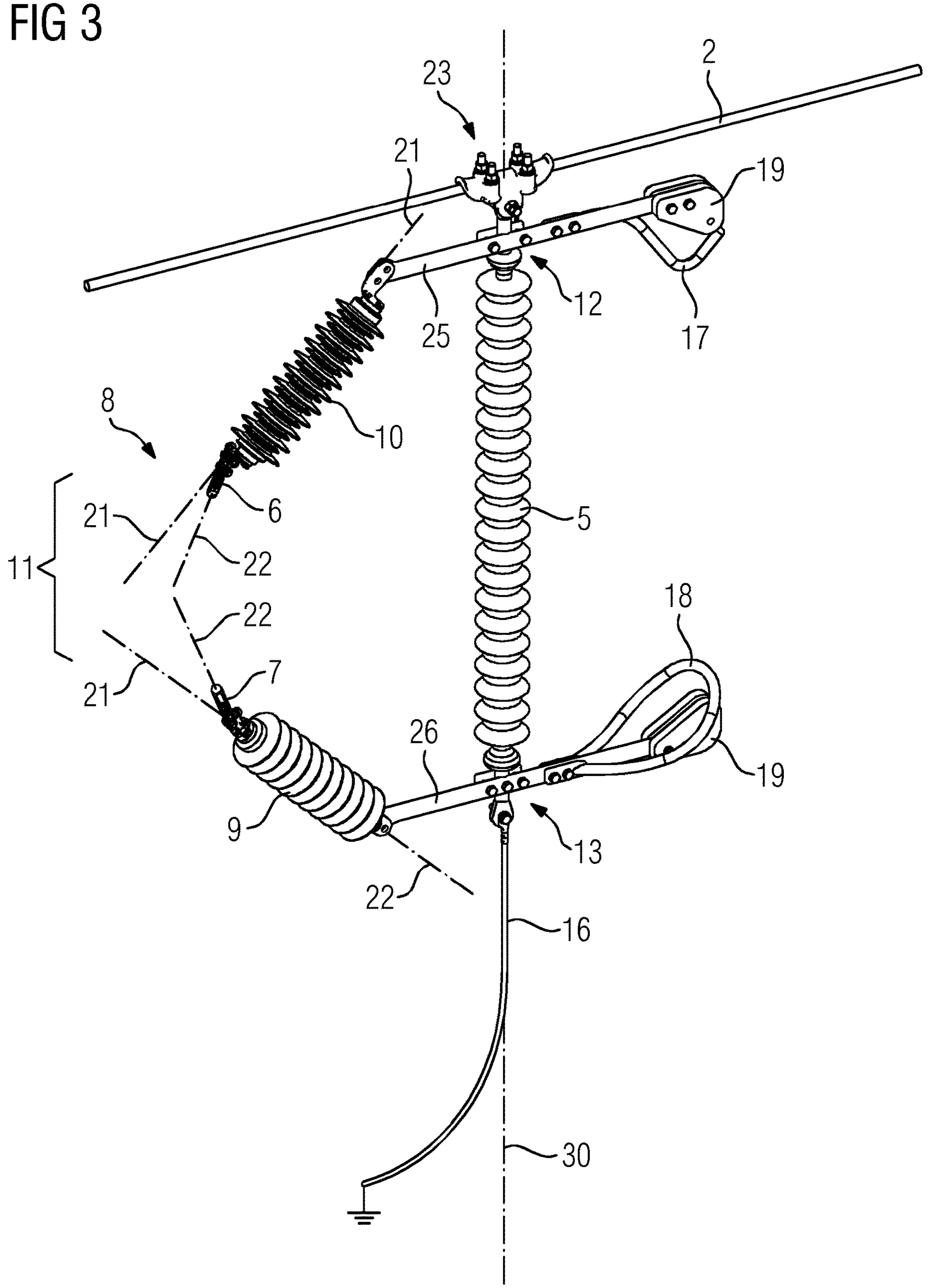
FIG. 3 shows a more detailed representation of the insulator arrangement of the type that can be used in the designs from FIGS. 1 and 2.

FIG. 3 shows a more detailed representation of the line arrester arrangement 8 from FIG. 2. The mounting insulator 5 is represented here as a long-rod insulator. Such a long-rod insulator comprises a core made from a glass fiber-reinforced plastic, onto which a protective sleeve, which is usually made from silicone, is applied. The protective sleeve usually comprises shields for lengthening the creepage distance. At a first end, the mounting insulator 5 comprises a securing device 12. The line arrester arrangement 8 is suspended on the overhead line 2 via a holding device 23 situated on the securing device 12. The first securing device 12 as well as the second securing device 13 each comprise a securing arm 25, 26, respectively. A surge arrester 9, 10 is secured to the securing arms 25, 26 at one end in each case.

The securing arms 25, 26 can extend away from their installation point on the mounting insulator 5 on both sides of the mounting insulator 5. The surge arrester 9 or, as shown in this case, two surge arresters 9, 10, are secured on one side of the mounting insulator 5. Further components of the line arrester arrangement 8 can then be secured to the opposite end. For example, arc electrodes 17, 18 can be situated there, as shown in this case, which, in the event that a surge arrester 9, 10 is defective, guide the electric arc occurring in the case of an overvoltage and keep it away from the mounting insulator 5. The spacing of the arc electrodes 17, 18 is smaller in this case than the length of the mounting insulator 5 and is greater than the spark gap 11.

One or both ends of the securing arms 25, 26 can be provided with field-control elements. Plates are situated here, which are rounded at the ends of the fastening arms 25, 26 positioned opposite the surge arresters 9, 10, thereby preventing voltage peaks.

Each surge arrester 9, 10 comprises a spark electrode 6, 7 at its end opposite the securing of the securing arm 25, 26. The spark electrodes 6, 7 are spaced apart from each other. This spacing forms the spark gap 11. The surge arresters 9, 10 comprise an electrically insulating protective housing for protection against weather conditions. Varistors, which are not shown here, are situated in the interior of the protective housing. The two surge arresters 9, 10 are separated from each other via the spark gap 11. The surge arresters 9, 10 are situated on the securing arms 25, 26 in such a way that their longitudinal axis 21 is situated at an angle with respect to the longitudinal axis 30 of the mounting insulator. The angle is approximately 45° in this case and can be between 30° and 60°. The spark electrodes 6, 7 are each situated on one end of the surge arrester 9, 10. Their longitudinal axis 22 is slanted with respect to the longitudinal axis 21 of the surge arrester 9, 10. Preferably, the spark electrodes 6, 7 are situated on the surge arresters 9, 10 in such a way that they are rotatable about the longitudinal axis 21 of the particular surge arrester 9, 10. As a result, the spacing of the spark electrodes 6, 7 and, therefore, the length of the spark gap 11 can be finely adjusted. The securing arm 25 is made from an electrically conductive material and establishes an electrical connection of the surge arrester via the securing device 12 and the holding device 23 to the overhead line 2 and, therefore, to the high voltage potential. The surge arrester 9, which is secured to the securing arm 26 at the second end of the mounting insulator 5 via the second securing device 13, is connected by means of an earthing cable 16 to the tower or a tower cross-arm 20 and to the earth.

The invention claimed is:

1. An insulator arrangement for an overhead line, the insulator arrangement comprising:
- a suspension insulator disposed above the overhead line for securing the overhead line to a tower;
- a line arrester arrangement disposed below the overhead line and connected electrically parallel to said suspension insulator;
- said line arrester arrangement including a mounting insulator to be secured to the overhead line, said mounting insulator having first and second ends;
- a first securing device disposed at said first end of said mounting insulator and a second securing device disposed at said second end of said mounting insulator;
- said line arrester arrangement including a surge arrester being electrically connected to earth potential;
- said line arrester arrangement including a spark gap connected in series with said surge arrester, said spark gap including first and second spark electrodes; and
- said first spark electrode being connected to the overhead line and being secured to said first securing device, and said second spark electrode being connected to said surge arrester and being secured to said second securing device.

2. The insulator arrangement according to claim 1, wherein said mounting insulator is a long-rod insulator.

3. An insulator arrangement for an overhead line, the insulator arrangement comprising:
- a suspension insulator for securing the overhead line to a tower;
- a line arrester arrangement disposed electrically parallel to said suspension insulator;
- said line arrester arrangement including a mounting insulator to be secured to the overhead line, said mounting insulator having first and second ends and said mounting insulator having a lower mechanical stability than said suspension insulator;
- a first securing device disposed at said first end of said mounting insulator and a second securing device disposed at said second end of said mounting insulator;
- said line arrester arrangement including a surge arrester being electrically connected to earth potential;
- said line arrester arrangement including a spark gap connected in series with said surge arrester, said spark gap including first and second spark electrodes; and
- said first spark electrode being connected to the overhead line and being secured to said first securing device, and said second spark electrode being connected to said surge arrester and being secured to said second securing device.

4. The insulator arrangement according to claim 1, wherein at least one of said first or second securing devices connects one of said first or second spark electrodes or said surge arrester to said mounting insulator in an angularly rigid manner.

5. An insulator arrangement for an overhead line, the insulator arrangement comprising:
- a suspension insulator for securing the overhead line to a tower;
- a line arrester arrangement disposed electrically parallel to said suspension insulator;
- said line arrester arrangement including a mounting insulator to be secured to the overhead line, said mounting insulator having first and second ends;
- a first securing device disposed at said first end of said mounting insulator and a second securing device disposed at said second end of said mounting insulator;
- said line arrester arrangement including a surge arrester being electrically connected to earth potential;
- said line arrester arrangement including a spark gap connected in series with said surge arrester, said spark gap including first and second spark electrodes; and
- said first spark electrode being connected to the overhead line and being secured to said first securing device, and said second spark electrode being connected to said surge arrester and being secured to said second securing device;
- said surge arrester being one of at least two surge arresters of said line arrester arrangement, said surge arresters each having a first end secured to a respective one of said securing devices in an angularly rigid manner, and said surge arresters each having a second end at which a respective one of said spark electrodes is disposed.

6. The insulator arrangement according to claim 5, wherein said at least two surge arresters are identically constructed.

7. An insulator arrangement for an overhead line, the insulator arrangement comprising:
- a suspension insulator for securing the overhead line to a tower;
- a line arrester arrangement disposed electrically parallel to said suspension insulator;

said line arrester arrangement including a mounting insulator to be secured to the overhead line, said mounting insulator having first and second ends;

a first securing device disposed at said first end of said mounting insulator and a second securing device disposed at said second end of said mounting insulator;

said line arrester arrangement including a surge arrester being electrically connected to earth potential;

said line arrester arrangement including a spark gap connected in series with said surge arrester, said spark gap including first and second spark electrodes; and said first spark electrode being connected to the overhead line and being secured to said first securing device, and said second spark electrode being connected to said surge arrester and being secured to said second securing device;

said surge arrester having a longitudinal axis and an end, and at least one of said spark electrodes being rod-shaped, being situated at said end of said surge arrester and having a longitudinal axis being slanted relative to said longitudinal axis of said surge arrester.

8. The insulator arrangement according to claim 7, wherein said at least one spark electrode is rotatable about said longitudinal axis of said surge arrester.

9. An insulator arrangement for an overhead line, the insulator arrangement comprising:

a suspension insulator for securing the overhead line to a tower;

a line arrester arrangement disposed electrically parallel to said suspension insulator;

said line arrester arrangement including a mounting insulator to be secured to the overhead line, said mounting insulator having first and second ends;

a first securing device disposed at said first end of said mounting insulator and a second securing device disposed at said second end of said mounting insulator;

said line arrester arrangement including a surge arrester being electrically connected to earth potential;

said line arrester arrangement including a spark gap connected in series with said surge arrester, said spark gap including first and second spark electrodes;

said first spark electrode being connected to the overhead line and being secured to said first securing device, and said second spark electrode being connected to said surge arrester and being secured to said second securing device;

said mounting insulator having installation points each disposed at a respective one of said ends of said mounting insulator;

said first and second securing devices each including a respective securing arm extending away from a respective one of said installation points, said securing arms each having two ends;

said surge arrester being disposed at one of said ends of one of said securing arms; and an arc electrode being disposed at another of said ends of said one securing arm opposite said surge arrester.

* * * * *